(12) United States Patent
Matsushita et al.

(10) Patent No.: US 8,455,769 B2
(45) Date of Patent: Jun. 4, 2013

(54) ELECTRONIC COMPONENT AND METHOD OF MOUNTING THE SAME

(75) Inventors: Yosuke Matsushita, Kyoto (JP); Mitsutoshi Imamura, Takatsuki (JP); Yukio Yamamoto, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 78 days.

(21) Appl. No.: 12/840,421

(22) Filed: Jul. 21, 2010

(65) Prior Publication Data

US 2010/0276190 A1   Nov. 4, 2010

Related U.S. Application Data

(63) Continuation of application No. PCT/JP2009/050579, filed on Jan. 16, 2009.

(30) Foreign Application Priority Data

Jan. 30, 2008   (JP) .................................. 2008-019838

(51) Int. Cl.
*H05K 1/16* (2006.01)
*H01G 4/05* (2010.01)

(52) U.S. Cl.
USPC ........... 174/260; 174/255; 174/261; 361/303; 361/306.1

(58) Field of Classification Search
None
See application file for complete search history.

(56) References Cited

U.S. PATENT DOCUMENTS

| | | | | |
|---|---|---|---|---|
| 5,549,778 A | * | 8/1996 | Yokoyama et al. | 156/246 |
| 6,312,791 B1 | * | 11/2001 | Fasano et al. | 428/210 |
| 7,206,187 B2 | * | 4/2007 | Satou | 361/309 |
| 2006/0119219 A1 | | 6/2006 | Kadotani et al. | |
| 2006/0278963 A1 | | 12/2006 | Harada et al. | |

FOREIGN PATENT DOCUMENTS

| | | |
|---|---|---|
| EP | 1 478 023 A1 | 11/2004 |
| JP | 2-72655 A | 3/1990 |
| JP | 2-83993 A | 3/1990 |
| JP | 2000-232179 A | 8/2000 |
| JP | 2000-277916 A | 10/2000 |
| JP | 2001-15549 A | 1/2001 |
| JP | 2002-231860 A | 8/2002 |
| JP | 2002-344123 A | 11/2002 |
| JP | 2003-213436 A | 7/2003 |
| JP | 2003-243797 A | 8/2003 |
| JP | 2005-303149 A | 10/2005 |
| JP | 2006-190959 A | 7/2006 |
| JP | 2006-344828 A | 12/2006 |

OTHER PUBLICATIONS

Official Communication issued in International Patent Application No. PCT/JP2009/050579, mailed on Mar. 24, 2009.

* cited by examiner

*Primary Examiner* — Jayprakash N Gandhi
*Assistant Examiner* — Dion Ferguson
(74) *Attorney, Agent, or Firm* — Keating & Bennett, LLP (57) ABSTRACT

An electronic component achieves significantly improved adhesion strength between an external electrode and a substrate body and includes an insulative substrate body, at least one groove disposed in at least one main surface of the substrate body, at least one external electrode disposed on the at least one main surface of the substrate body, wherein a portion of the at least one external electrode is disposed in at least a portion of the groove.

13 Claims, 7 Drawing Sheets

ELECTRONIC COMPONENT AND METHOD OF MOUNTING THE SAME

BACKGROUND OF THE INVENTION

1. Field of the Invention

The present invention relates to electronic components and, more particularly, to an electronic component including an external electrode.

2. Description of the Related Art

In a wiring board in which an external electrode is formed on a substrate body made of, for example, resin or ceramics, it is necessary to ensure the adhesion strength of the external electrode on the substrate body so that the external electrode is not detached from the substrate body after the wiring board is mounted.

Figure 9:
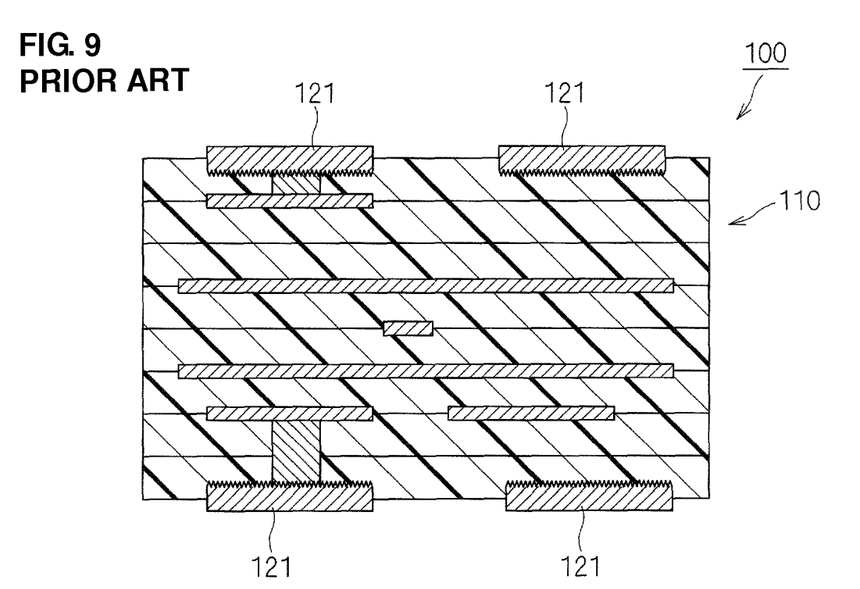
FIG. 9 is a cross-sectional view of a conventional electronic component.

For example, in a multilayer substrate 100 shown in a cross-sectional view in FIG. 9, the surface roughness of a surface that is in contact with a substrate body 110 made of resin of each external electrode 121 that is externally exposed on the front and rear surfaces of the substrate body 110 is set to a value higher than the surface roughness of the internal electrode pattern. Accordingly, the anchor effect for the substrate body 110 is increased to improve the adhesion strength of the external electrode 121 (for example, refer to Japanese Unexamined Patent Application Publication No. 2006-344828).

However, since the surfaces of copper foils each having a thickness of 35 μm are roughened by, for example, surface treatment to be used as the external electrodes in this multilayer substrate, the surface roughness in the multilayer substrate is not so great. Particularly, when the external electrodes are reduced in size, the external electrodes may not have a sufficient adhesion strength with the multilayer substrate. In addition, since the surfaces of the copper foils are uniformly roughened by the surface treatment or the like, the external electrodes have a direction that is weak in an impact applied from, for example, a side surface of the multilayer substrate mounted on a printed circuit board or the like due to the shapes of the electrodes and the chips, and the improvement effect of the adhesion strength against the impact from the direction is reduced.

SUMMARY OF THE INVENTION

In order to solve the above problems, preferred embodiments of the present invention provide an electronic component having a further improved adhesion strength between an external electrode and a substrate body.

According to a preferred embodiment of the present invention, an electronic component includes an insulative substrate body, at least one groove formed in at least one main surface of the substrate body, and at least one external electrode arranged on the at least one main surface of the substrate body and a portion of which is disposed in at least a portion of the groove.

Since the portion of the external electrode disposed on the one main surface of the substrate body in the above configuration is disposed in at least a portion of the groove or the entire groove to increase the resistance force, compared with the case in which the surface of the external electrode toward the substrate body is roughened, the adhesion strength between the external electrode and the substrate body is significantly increased.

The adhesion strength between the external electrode and the substrate body is greatly increased particularly against a force vertical to the direction in which the groove extends.

Accordingly, forming the groove so as to extend vertically relative to the direction in which the adhesion strength between the external electrode and the substrate body is small allows the adhesion force to be increased especially in the direction in which the adhesion strength is small.

Preferably, the substrate body includes at least one set of grooves that are formed in the one main surface and that extend in parallel or substantially in parallel to each other.

Preferably, at least two sets of grooves that extend in parallel or substantially in parallel to each other are provided and the grooves in one set intersect with the grooves in the other set. Also preferably, the portion of the external electrode is disposed in at least a portion of the grooves in the one set and at least a portion of the grooves in the other set.

In the above case, the adhesion strength can be increased in multiple directions due to the grooves that intersect with each other. For example, the above configuration is effective in a case in which the adhesion strength is small in multiple directions. In addition, the adhesion strength can be entirely increased in all the directions.

More preferably, the grooves in the one set are perpendicular or substantially perpendicular to the grooves in the other set.

The grooves that are perpendicular or substantially perpendicular to each other can be easily formed, compared with the grooves that intersect with each other at an angle.

Preferably, the one main surface of the substrate body has a rectangular or substantially rectangular shape having one pair of longer sides and one pair of shorter sides. Also preferably, the at least one groove is arranged so as to extend in parallel or substantially in parallel to the longer sides of the one main surface of the substrate body.

When one main surface of the substrate body of an electronic component has a rectangular or substantially rectangular shape, the adhesion strength between the external electrode and the substrate body when a force perpendicular or substantially perpendicular to the longer sides of the one main surface of the substrate body is exerted along the one main surface of the substrate body may be smaller than the adhesion strength between the external electrode and the substrate body when a force perpendicular or substantially perpendicular to the shorter sides of the one main surface of the substrate body is exerted along the one main surface of the substrate body due to, for example, the difference in length of the moment arm.

In contrast, when multiple external electrodes are arranged on the longer sides of the one main surface of the substrate body, the adhesion strength between the external electrode and the substrate body when a force perpendicular or substantially perpendicular to the shorter sides of the one main surface of the substrate body is exerted may be smaller than that when a force perpendicular or substantially perpendicular to the longer sides of the one main surface of the substrate body is exerted.

When the groove extends vertically to the exerted force and a portion of the external electrode is disposed in the groove in the above case, as in the above configuration, the resistance force applied when a force perpendicular or substantially perpendicular to a certain side of the one main surface of the substrate body is exerted along the one main surface of the substrate body can be increased to increase the adhesion strength between the external electrode and the substrate body.

Preferably, the one main surface of the substrate body has a rectangular or substantially rectangular shape having one pair of longer sides and one pair of shorter sides, the external electrode is disposed on each of the pair of shorter sides of the substrate body, and the at least one groove is formed so as to extend in parallel or substantially in parallel to the longer sides of the one main surface of the substrate body.

Preferably, the external electrode has a main surface of a rectangular or substantially rectangular shape having one pair of longer sides and one pair of shorter sides. Also preferably, the at least one set of grooves is arranged so as to extend in parallel or substantially in parallel to the longer sides of the main surface of the external electrode.

When the main surface of the external electrode has a rectangular or substantially rectangular shape, the adhesion strength between the external electrode and the substrate body when a force perpendicular or substantially perpendicular to the longer sides of the main surface of the external electrode is exerted along the main surface of the external electrode may be smaller than that when a force perpendicular or substantially perpendicular to the shorter sides of the main surface of the external electrode is exerted along the main surface of the external electrode.

When the groove extends in parallel or substantially in parallel to the longer sides of the external electrode and a portion of the external electrode enters the groove in the above case, as in the above configuration, the resistance force applied when a force perpendicular or substantially perpendicular to the longer sides of the external electrode is exerted along the main surface of the external electrode can be increased to increase the adhesion strength between the external electrode and the substrate body.

Preferably, the substrate body has a rectangular or substantially rectangular shape, a plurality of external electrodes are arranged so as to extend in parallel or substantially in parallel to at least one side of the substrate body, and the at least one groove is arranged so as to be substantially perpendicular to the direction in which the plurality of external electrodes extend.

Preferably, the one main surface of the substrate body includes a high-density distribution area in which the external electrodes are distributed at a relatively high density and a low-density distribution area in which the external electrodes are distributed at a relatively low density. Also preferably, the interval between the grooves where the portion of the external electrodes in the low-density distribution area is disposed therein is shorter than the interval between the grooves where the portion of the external electrodes in the high-density distribution area is disposed therein.

Decreasing the interval of the grooves corresponding to the external electrodes in the low-density distribution area allows the number of the grooves to be increased and allows the adhesion strength per unit area of the external electrodes in the low-density distribution area to be greater than the adhesion strength per unit area of the external electrodes in the high-density distribution area. Stress, such as an impact, tends to increase in the external electrodes in the low-density distribution area and tends to decrease in the external electrodes in the high-density distribution area. Accordingly, making the adhesion strength per unit area of the external electrodes in the low-density distribution area greater than that of the external electrodes in the high-density distribution area allows the adhesion strength to be entirely increased.

Preferably, the grooves are located near a peripheral line of the one main surface of the substrate body.

When the electronic component is mounted on another substrate, the stress between the external electrode and the substrate body is maximized near the peripheral line of the main surface at the mounting side. Configuring the electronic component so that the groove is disposed in the area where the maximum stress is applied and a portion of the external electrode is disposed in the groove allows the adhesion strength between the external electrode and the substrate body to be increased.

Preferably, the depth of the grooves relatively close to the peripheral line of the one main surface of the substrate body is greater than the depth of the grooves relatively far from the peripheral line of the one main surface of the substrate body.

The adhesion strength of the external electrodes can be increased with the increasing depth of the grooves where a portion of the external electrodes is disposed therein. Since the stress applied between the external electrode and the substrate body is increased with the decreasing distance from the peripheral line of the main surface of the substrate body, the depth of the grooves is increased with the decreasing distance from the peripheral line of the main surface of the electronic component to increase the adhesion strength between the external electrode and the substrate body. This allows the adhesion strength to be made uniform as much as possible.

Preferably, the external electrode is a land grid array (LGA) electrode, for example.

Since it is difficult to increase the electrode area to increase the adhesion strength in the LGA electrode having a smaller electrode area, adopting the configuration in which a portion of the external electrode is disposed in the grooves to increase the adhesion strength has a particularly large effect.

In addition, another preferred embodiment of the present invention provides a method of mounting the electronic component having any of the above configurations, in which the one main surface of the substrate body where the groove is provided is used as a mounting surface.

According to various preferred embodiments of the present invention, since at least a portion of the external electrode is disposed in the groove provided in the substrate body, it is possible to further increase the adhesion strength between the external electrode and the substrate body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Exemplary preferred embodiments of the present invention will herein be described with reference to FIGS. 1 to 8C.

First Preferred Embodiment

An electronic component 10 of a first preferred embodiment will now be described with reference to FIGS. 1 to 3B.

Figure 1:
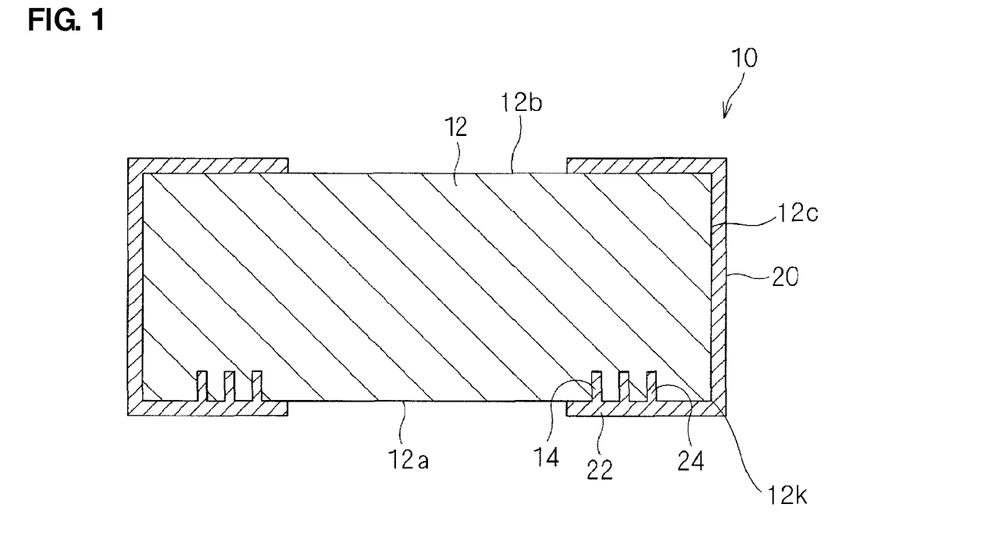
FIG. 1 is a cross-sectional view of an electronic component according to a first preferred embodiment of the present invention.

As shown in a cross-sectional view in FIG. 1, the electronic component 10 of the first preferred embodiment is a surface mount device in which external electrodes 20 are provided at both sides of a substrate body 12. The substrate body 12 includes multiple grooves 14 that are parallel or substantially parallel to each other in a rear surface 12a, which is one main surface at a side where the electronic component 10 is mounted. The grooves 14 are preferably located in areas close to a peripheral line 12k of the rear surface 12a of the substrate body 12. Each external electrode 20 is formed so that portions 24 of the external electrode 20 enter the grooves 14.

For example, when the substrate body 12 is a ceramic multilayer substrate, the grooves 14 are formed in advance on a ceramic green sheet by, for example, laser processing; a rear electrode 22 is arranged so that the material of the electrode enters the grooves 14; the ceramic green sheet is laminated on other ceramic green sheets; and the ceramic green sheets are fired. After the ceramic multilayer substrate subjected to the firing is divided into chips, the external electrode 20 is preferably arranged on a front surface 12b and/or an end surface 12c, if needed.

The material of the substrate body 12 is not limited to ceramics and the substrate body 12 may be made of any material, such as resin or glass, which is generally used as the material of insulating layers and/or dielectric layers of electronic components. In addition, the substrate body 12 may have a single layer or multiple layers.

The method of forming the grooves 14 is not limited to the laser processing, and the grooves 14 may be formed by any method in which a cutting blade, such as a dicing blade, can be used to make cuts each having arbitrary depth and shape at arbitrary portions, for example.

When the grooves are formed by the laser processing, the laser may be scanned to form the grooves or successive depressions are formed with the laser to form the grooves. When the grooves are formed from the depressions, adjacent depressions may be overlapped with each other to form each groove or the depressions may be spaced apart by a predetermined distance to form each groove.

The external electrode 20 may be formed by printing and applying a paste, may be formed of a thin film by, for example, sputtering, or may be formed by spraying with, for example, an inkjet device.

The grooves 14 and the external electrode 20 may be formed at any timing. For example, the grooves 14 and the external electrode 20 may be formed on sheets before the lamination, may be formed after the lamination, or may be formed after the substrate is divided in the chips. In addition, the grooves 14 and the external electrode 20 may be formed before the firing or after the firing.

Figure 3A:
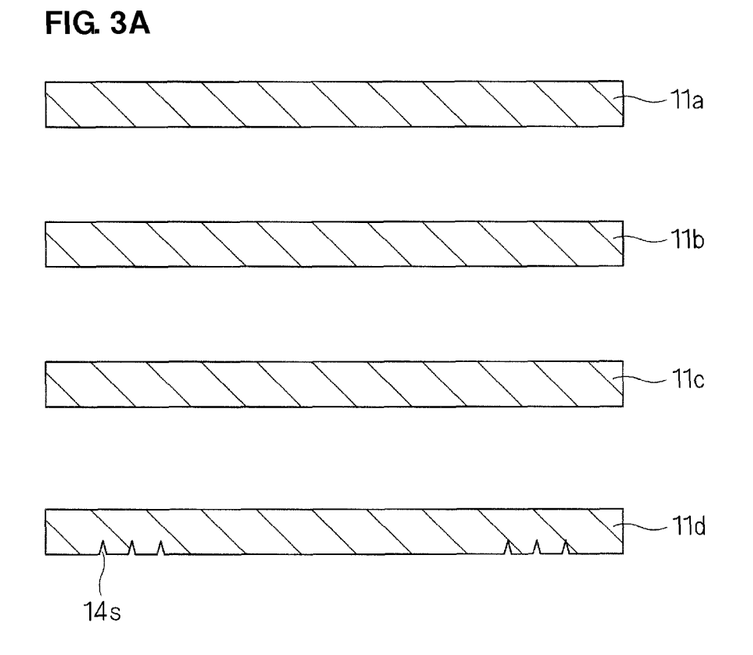
FIGS. 3A and 3B are cross sectional views showing how to manufacture the electronic component according to the first preferred embodiment of the present invention.
Figure 3B:
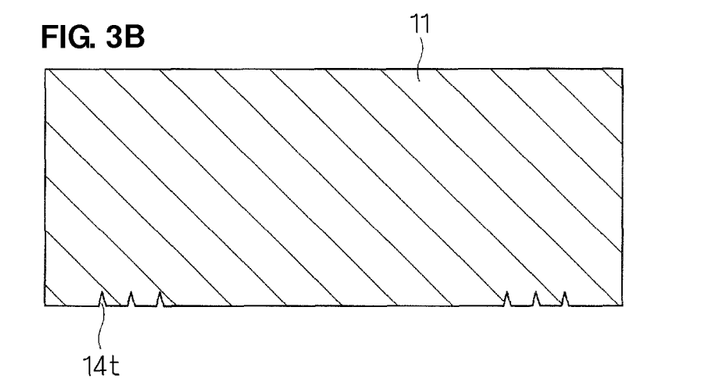

For example, with the lamination method, as shown in a cross-sectional view in FIG. 3A, grooves 14s may be formed in the state of sheets 11a to 11d before the lamination. Alternatively, as shown in a cross-sectional view in FIG. 3B, grooves 14t may be formed in a multilayer body 11 resulting from integration of laminated sheets.

The configuration in which the portions 24 of the external electrode 20 are disposed in the grooves 14, as in the electronic component 10, is applicable to every chip size and every terminal arrangement. The configuration is also applicable to a land grid array (LGA)-type electronic component, for example.

The grooves 14 may be formed at any portions where the external electrode 20 can be joined. Specifically, the portion where the grooves 14 are formed is not limited to the rear surface 12a and may be formed on the front surface 12b or the end surface 12c. The number and direction of the grooves 14 are not particularly specified or limited.

When the surface of the external electrode toward the substrate body is roughened, the adhesion strength is increased with the increasing contact area to increase the fixing force. In contrast, when the grooves 14 are formed in the manner in the first preferred embodiment, the contact area is increased and the resistance force against a force that is applied in parallel or substantially in parallel or vertically to the mounting surface, that is, the rear surface 12a is applied because the portions 24 of the external electrode 20 enter the grooves 14. Accordingly, the adhesion strength between the external electrode 20 and the substrate body 12 is significantly increased.

When the electronic component 10 is mounted on another substrate, the stress between the external electrode 20 and the substrate body 12 is maximized in the area close to the peripheral line 12k of the rear surface 12a, which is the main surface at the mounting side. Configuring the electronic component so that the grooves 14 are formed in the area close to the peripheral line 12k where the maximum stress is applied and the portions 24 of the external electrode 20 disposed in the grooves 14 allows the adhesion strength between the external electrode 20 and the substrate body 12 to be increased.

Figure 2:
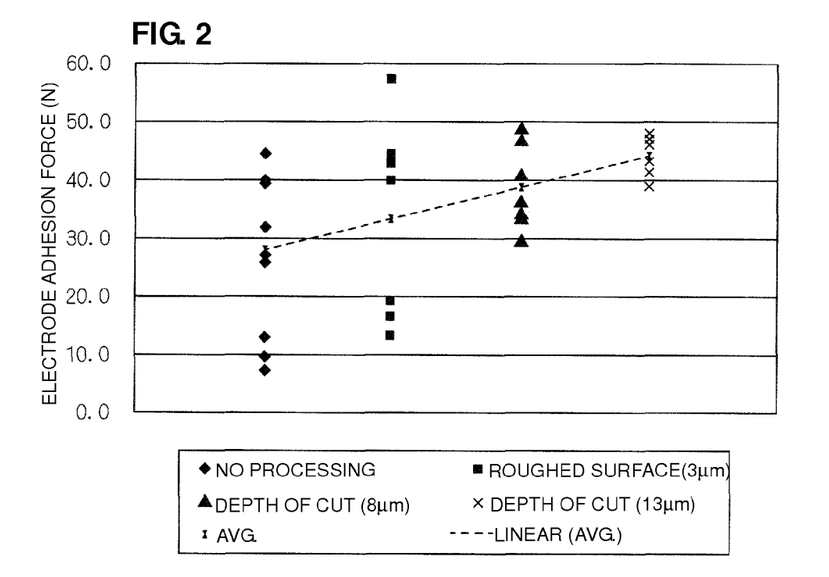
FIG. 2 is a graph showing electrode adhesion forces of the prior art and according to the first preferred embodiment of the present invention.

A graph in FIG. 2 illustrates an example of the result of experiments indicating the relationship between the adhesion force of the external electrode and the surface treatment state. Referring to FIG. 2, ♦ denotes each value in a case in which the surface of the external electrode toward the substrate body is not particularly processed, ■ denotes each value in a case in which the surface of the external electrode toward the substrate body is processed at a surface roughness of about 3 μm, ▲ denotes each value in a case in which the surface is processed so that a portion of the external electrode is disposed in the grooves that each have a depth of about 8 μm and that are formed in the substrate body, and x denotes each value in a case in which the surface is processed so that a portion of the external electrode is disposed in the grooves that each have a depth of about 13 μm and that are formed in the substrate body. A broken line connects the average values in the respective cases. The electrode adhesion force represented as the vertical axis indicates the measured value of the magnitude of each force applied when a force that is parallel or substantially parallel to the mounting surface and that is opposite to the force applied to the mounting surface is exerted between a sample and another substrate in a state in which the external electrode of the sample is mounted on the other substrate to cause the external electrode of the sample to be detached from the substrate body.

The graph in FIG. 2 shows that the configuration in which a portion of the external electrode enters the grooves has an adhesion strength greater than that of the configuration in which the surface of the external electrode is roughened. In addition, the variation in the adhesion strength is reduced in the configuration in which a portion of the external electrode is disposed in the grooves to improve the quality of the electronic component. Furthermore, the graph in FIG. 2 shows that the adhesion strength is increased with the increasing depth of the grooves. In order to achieve an electrode adhesion force of about 30 N or greater, it is sufficient to set the depth of the grooves to a value not lower than about 5 μm, for example. It is more preferable to form the grooves having a depth of about 8 μm or higher, for example.

The adhesion strength of the external electrode 20 can be increased with the increasing depth of the grooves 14 where the portions 24 of the external electrode 20 are disposed therein. Since the stress applied between the external electrode and the substrate body 12 is increased with the decreasing distance from the peripheral line 12k of the rear surface 12a of the substrate body 12, the depth of the grooves 14 may be increased with the decreasing distance from the peripheral line 12k to increase the adhesion strength between the external electrode 20 and the substrate body 12. In this case, it is possible to make the adhesion strength as uniform as possible.

Second Preferred Embodiment

An electronic component of a second preferred embodiment will now be described with reference to FIG. 4.

Figure 4:
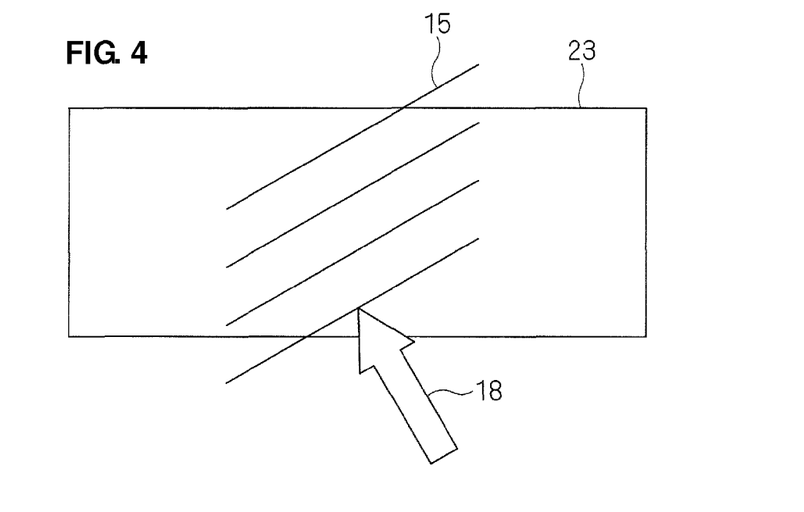
FIG. 4 is a perspective view of the main portion of an electronic component according to a second preferred embodiment of the present invention.

FIG. 4 is a perspective view of the main portion, schematically showing an external electrode 23 and grooves 15 disposed in the substrate body. The multiple grooves 15 are preferably arranged so as to be parallel or substantially parallel to each other. A portion of the external electrode 23 is disposed in the grooves 15 in a portion where the grooves 15 are covered with the external electrode 23.

The adhesion strength of the external electrode 23 is increased against a force indicated by an arrow 18 in FIG. 4, that is, a force that is vertically exerted with respect to the direction in which the grooves 15 extend, compared with the case where the grooves 15 are not formed. Accordingly, the grooves 15 that vertically extend with respect to the direction in which the adhesion strength of the external electrode 23 is small are disposed in the area of the substrate body where the external electrode 23 is located.

The fixing force of an electronic component is varied due to the effect of, for example, the chip size, the arrangement of terminals, the area (width) of the external electrode, and/or the configuration of the external electrode (the presence of an end surface electrode portion). Configuring the electronic component so that the grooves are arranged so as to vertically extend with respect to the direction in which the adhesion strength of the external electrode is small and a portion of the external electrode is disposed in the grooves allows the adhesion strength to be increased especially in the direction in which the adhesion strength of the external electrode is small.

Third Preferred Embodiment

An electronic component of a third preferred embodiment will now be described with reference to FIG. 5.

Figure 5:
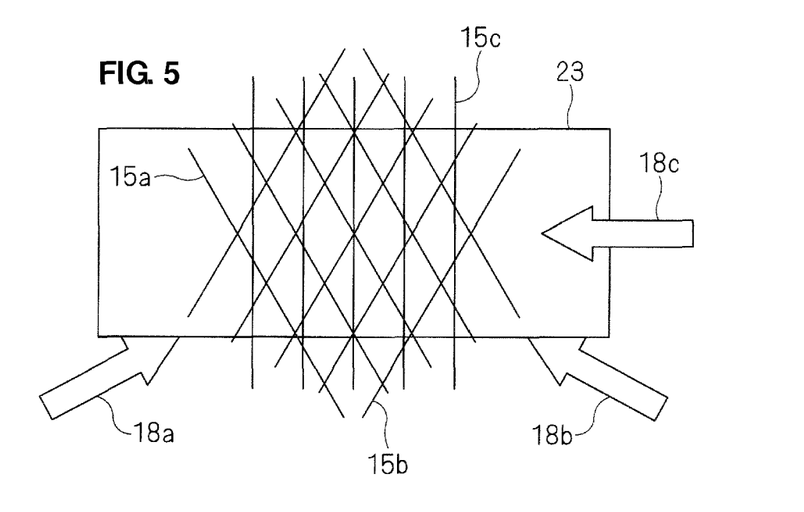
FIG. 5 is a perspective view of the main portion of an electronic component according to a third preferred embodiment of the present invention.

As schematically shown in a perspective view of the main portion in FIG. 5, grooves 15a, 15c, and 15c in multiple directions are provided in the substrate body and the grooves 15a, 15b, and 15c are covered with the external electrode 23. A portion of the external electrode 23 is disposed in the grooves 15a, 15c, and 15c in portions where the grooves 15a, 15c, and 15c are covered with the external electrode 23. The multiple grooves 15a, 15c, and 15c are preferably arranged so as be parallel or substantially parallel to each other. The grooves are preferably arranged in two or more directions, and the directions of the grooves may be perpendicular or substantially perpendicular to each other, for example.

The adhesion strength of the external electrode 23 is increased against forces in the directions indicated by arrows 18a, 18b, and 18c in FIG. 5, that is, forces that are vertically exerted with respect to the respective directions in which the grooves 15a, 15b, and 15c extend.

The formation of the grooves in the multiple directions allows the adhesion strength to be entirely increased not only in a specific direction where the adhesion strength of the external electrode is small but also in all the directions.

Fourth Preferred Embodiment

An electronic component of a fourth preferred embodiment will now be described with reference to FIGS. 6A-6C.

Figure 6A:
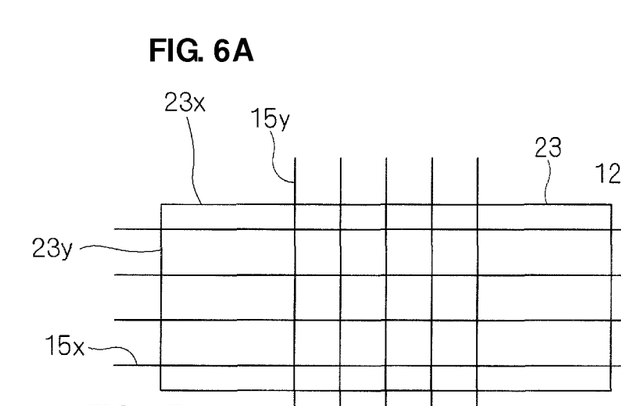
FIG. 6A is a perspective view of the main portion of an electronic component.
Figure 6B:
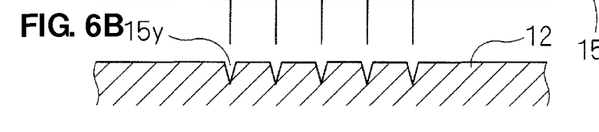
FIG. 6B is a cross-sectional view of the main portion of the electronic component.
Figure 6C:
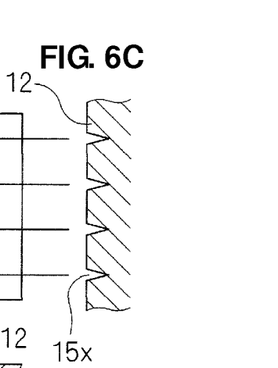
FIG. 6C is a cross-sectional view of the main portion of the electronic component according to a fourth preferred embodiment of the present invention.

FIG. 6A is a perspective view of the main portion, schematically showing the relationship between grooves 15x and 15y disposed in the substrate body and the external electrode 23. FIG. 6B is a cross-sectional view of the main portion, showing the cross section of the grooves 15x provided in the substrate body 12. FIG. 6C is a cross-sectional view of the main portion, showing the cross section of the grooves 15y provided in the substrate body 12.

As shown in FIG. 6A, in the substrate body 12, the multiple grooves 15x are preferably arranged in parallel or substantially parallel to each other along the longer side of the rectangular external electrode 23 and the multiple grooves 15y are arranged in parallel or substantially in parallel to each other along the shorter side of the external electrode 23. Although the grooves 15x and 15y are preferably configured to have a V shape, for example, that is, the widths of the grooves 15x and 15y are decreased with the increasing depths, as shown in FIGS. 6B and 6C, the grooves 15x and 15y may have a constant width regardless of the depths, as in the first preferred embodiment.

When the grooves are arranged in multiple directions, the grooves are preferably formed so that the depth of the grooves vertically extending with respect to the direction in which the adhesion strength of the external electrode 23 is small is greater than the depth of the other grooves. For example, when the adhesion strength of the external electrode 23 is small against the force in the longitudinal direction in FIG. 6A, the grooves 15x are arranged so that the depth of the grooves 15x laterally extending in FIG. 6A is greater than the depth of the other grooves 15y.

Varying the depths of the grooves in multiple directions depending on the directions of the grooves allows the adhesion strength of the external electrode 23 to be completely improved and allows for the improvement especially in the direction in which the adhesion strength of the external electrode 23 is small.

When the external electrode 23 has a rectangular or substantially rectangular main surface, the adhesion strength between the external electrode 23 and the substrate body 12 when a force perpendicular or substantially perpendicular to a longer side 23x of the main surface of the external electrode 23 is exerted along the main surface of the external electrode 23 may be smaller than that when a force perpendicular or substantially perpendicular to a shorter side 23y of the main surface of the external electrode 23 is exerted along the main surface of the external electrode 23.

When a portion of the external electrode 23 is caused to enter the grooves 15x extending in parallel or substantially in parallel to the longer side 23x of the external electrode 23 in the above case, it is possible to increase the resistance force against the force that is exerted along the main surface of the external electrode 23 and that is perpendicular or substantially perpendicular to the longer side 23x of the external electrode 23, thus increasing the adhesion strength between the external electrode 23 and the substrate body 12.

In addition, the grooves 15x and 15y that are perpendicular or substantially perpendicular to each other can be easily formed, compared with the grooves that intersect with each other at an angle with respect to each other.

Fifth Preferred Embodiment

An electronic component 10a of a fifth preferred embodiment will now be described with reference to FIG. 7.

Figure 7:
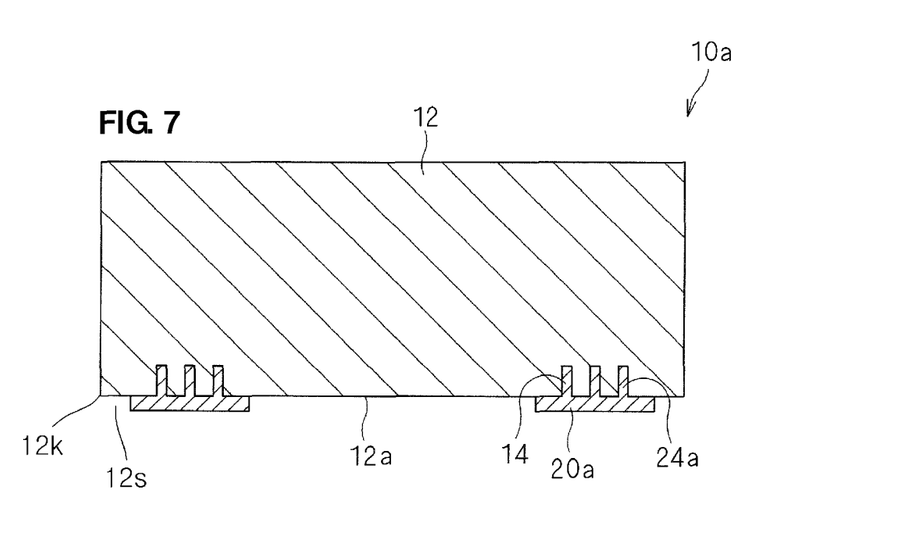
FIG. 7 is a cross-sectional view of an electronic component according to a fifth preferred embodiment of the present invention.

As shown in a cross-sectional view in FIG. 7, the electronic component 10a of the fifth preferred embodiment preferably is an LGA component in which each external electrode 20a is disposed inwardly from the peripheral line 12k of the rear surface 12a of the substrate body 12 by a distance 12s. The substrate body 12 is preferably constructed so that the multiple grooves 14 that are parallel or substantially parallel to each other are arranged in areas close to the peripheral line 12k and portions 24a of each external electrode 20a are disposed in the grooves 14, as in the electronic component 10 of the first preferred embodiment.

Since the area of the electrodes cannot be increased in the LGA component, it is difficult to ensure the adhesion strength of the external electrodes. However, configuring the LGA component so that the grooves are provided in the substrate body and portions of the external electrodes are disposed in the grooves allows the adhesion strength of the external electrodes to be increased.

Figure 10:
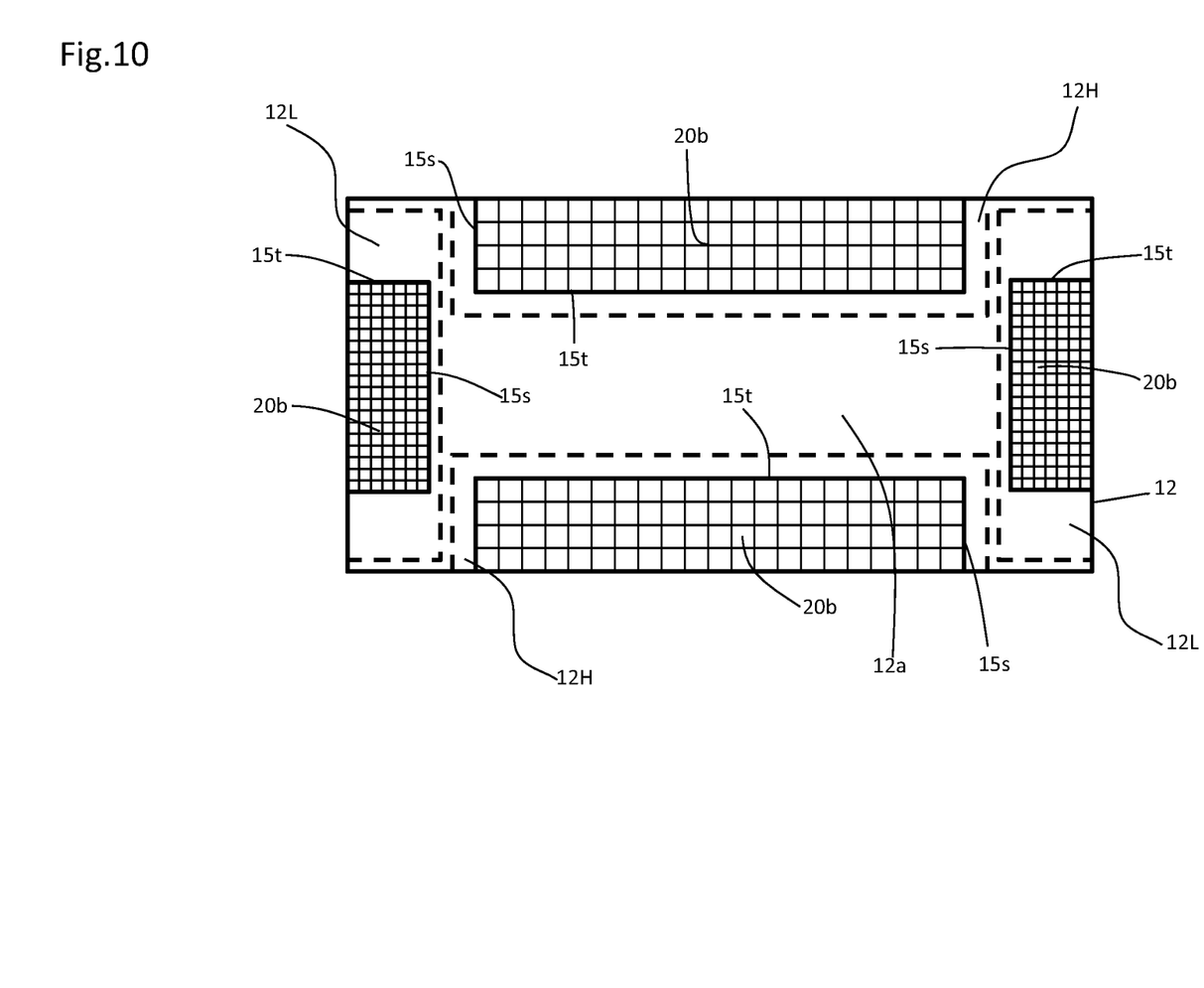
FIG. 10 is a plan view of a substrate body according to another preferred embodiment of the present invention.

Particularly, as shown in FIG. 10, there are cases in which the external electrodes 20b are not uniformly distributed on one main surface 12a of the substrate body 12 in the LGA component. In such cases, it is preferred that the interval of the grooves 15s and 15t where portions of the external electrodes 20b enter in a low-density distribution area 12L in which the external electrodes 20b are distributed at a relatively low density be shorter than the interval of the grooves 15s and 15t where portions of the external electrodes 20b enters in a high-density distribution area 12H in which the external electrodes 20b are distributed at a relatively high density. As used herein, the term "density" means the percentage of a particular area, i.e., the low-density distribution area 12L or the high-density distribution area 12H, that is occupied by the external electrode(s).

The LGA electrode may preferably include the end surfaces of via holes. In such a case, the grooves may be arranged in the end surfaces of the via holes in order to increase the adhesion strength of the LGA electrode.

As shown in FIG. 10, decreasing the interval of the grooves 15s and 15t corresponding to the external electrodes 20b in the low-density distribution area 12L allows the number of the grooves to be increased and allows the adhesion strength per unit area of the external electrodes 20b in the low-density distribution area 12L to be greater than the adhesion strength per unit area of the external electrodes 20b in the high-density distribution area 12H. Stress, such as an impact, tends to increase in the external electrodes 20b in the low-density distribution area 12L and tends to decrease in the external electrodes 20b in the high-density distribution area 12H. Accordingly, making the adhesion strength per unit area of the external electrodes 20b in the low-density distribution area 12L greater than that of the external electrodes 20b in the high-density distribution area 12H allows the adhesion strength to be entirely increased.

Sixth Preferred Embodiment

An electronic component 10b of a sixth preferred embodiment will now be described with reference to FIGS. 8A-8C.

Figure 8A:
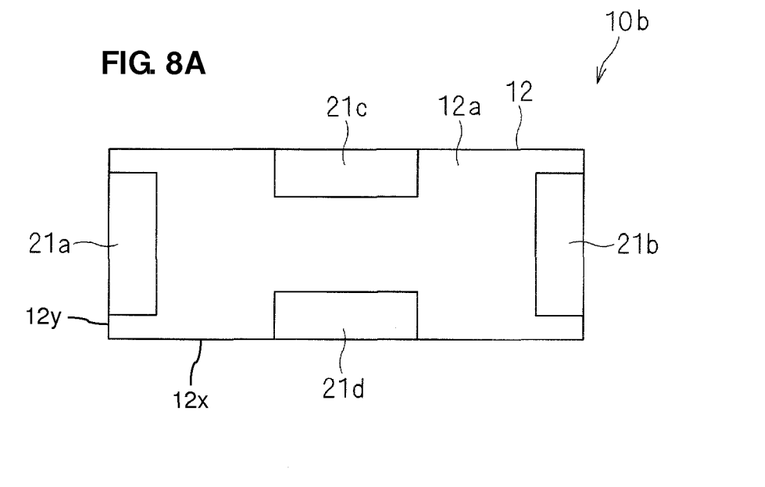
FIG. 8A is a plan view of an electronic component.
Figure 8B:
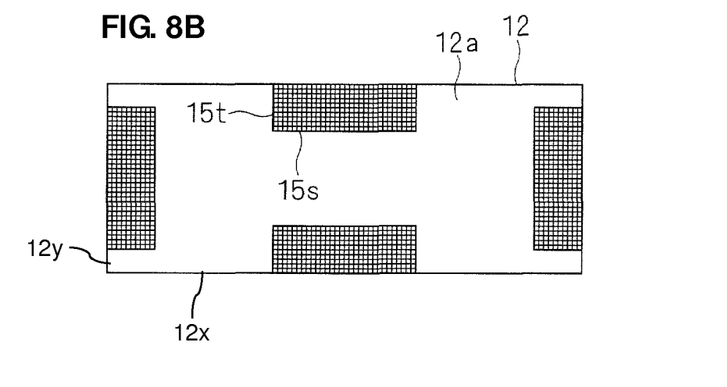
FIG. 8B is a plan view of a substrate body.

FIG. 8A is a plan view of the electronic component 10b. FIGS. 8B and 8C are plan views of the substrate body 12 of the electronic component 10a.

As shown in FIG. 8A, in the electronic component 10b, four rectangular or substantially rectangular external electrodes 21a, 21b, 21c, and 21d are disposed on the rectangular or substantially rectangular rear surface 12a of the substrate body 12. As shown in FIG. 8B, straight grooves 15s and 15t that are perpendicular or substantially perpendicular to each other are provided in areas corresponding to the areas where the external electrodes 21a, 21b, 21c, and 21d are disposed in the rear surface 12a of the substrate body 12.

Figure 8C:
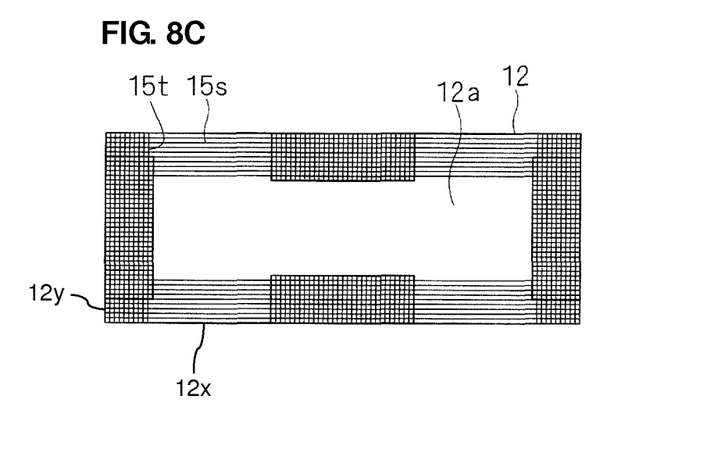
FIG. 8C is a plan view of a substrate body according to a sixth preferred embodiment of the present invention.

As shown in FIG. 8C, the grooves 15s and 15t may be arranged so as to protrude outwardly from the areas where the external electrodes 21a, 21b, 21c, and 21d are provided. When the grooves are also provided in areas other than the areas where the external electrodes are disposed in the above manner, advantages in processing may be achieved. For example, the necessity of processing accuracy of the grooves can be alleviated.

When the substrate body 12 of the electronic component 10b has the rectangular or substantially rectangular rear surface 12a, the adhesion strength between the external electrodes 21a to 21d and the substrate body 12 when a force perpendicular or substantially perpendicular to a longer side 12x of the rear surface 12a is exerted (exerted longitudinally in the drawings) along the rear surface 12a of the substrate body 12 may be smaller than the adhesion strength between the external electrodes 21a to 21d and the substrate body 12 when a force perpendicular or substantially perpendicular to a shorter side 12y of the rear surface 12a is exerted (exerted laterally in the drawings) along the rear surface 12a of the substrate body 12 due to, for example, the difference in length of the moment arm.

When the grooves 15s extend in parallel or substantially in parallel to the longer side 12x of the rear surface 12a of the substrate body 12 and a portion of the external electrodes 21a to 21d is caused to be disposed in the grooves 15s in the above case, it is possible to increase the resistance force against the force that is exerted along the rear surface 12a of the substrate body 12 and that is perpendicular or substantially perpendicular to the longer side 12x of the rear surface 12a (longitudinally in the drawings), thus increasing the adhesion strength between the external electrodes 21a to 21d and the substrate body 12.

As described above, configuring the electronic component so that the grooves are provided in the substrate body and portions of the external electrodes are disposed in the grooves allows the adhesion strength between the external electrodes and the substrate body against, for example, the force vertical to the direction in which the grooves extend to be significantly increased, compared with the case in which the surfaces of the external electrodes toward the substrate body are roughened.

The present invention is not restricted to the above preferred embodiments and may be embodied in various modes.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component comprising:
an insulative substrate body including at least one groove located on at least one main surface thereof, the at least one groove having an elongated, substantially linear shape extending along the at least one main surface of the insulative substrate body; and
at least one external electrode arranged on the at least one main surface of the substrate body; wherein
a portion of the at least one external electrode is disposed in at least a portion of the at least one groove; and
the portion of the at least one external electrode disposed in at least a portion of the at least one groove is not physically connected to or in physical contact with any elements of the electronic component other than the insulative substrate body.

2. The electronic component according to claim 1, wherein the substrate body includes at least one set of grooves that are disposed in the at least one main surface and that extend in parallel or substantially in parallel relative to each other.

3. The electronic component according to claim 2, wherein at least two sets of grooves that extend in parallel or substantially in parallel relative to each other are provided and the grooves in a first of the at least two sets intersect with the grooves in a second of the at least two sets, and the at least a portion of the at least one external electrode is disposed in at least a portion of the grooves in the first of the at least two sets and in at least a portion of the grooves in the second of the at least two sets.

4. The electronic component according to claim 3, wherein the grooves in the first of the at least two sets are perpendicular or substantially perpendicular to the grooves in the second of the at least two sets.

5. The electronic component according to claim 1, wherein the at least one main surface of the substrate body has a rectangular or substantially rectangular shape including one pair of longer sides and one pair of shorter sides, and the at least one groove is arranged so as to extend in parallel or substantially in parallel to the longer sides of the one main surface of the substrate body.

6. The electronic component according to claim 1, wherein the at least one main surface of the substrate body has a rectangular or substantially rectangular shape including one pair of longer sides and one pair of shorter sides, the at least one external electrode is disposed on each of the pair of shorter sides of the substrate body, and the at least one groove is arranged so as to extend in parallel or substantially in parallel to the longer sides of the at least one main surface of the substrate body.

7. The electronic component according to claim 1, wherein the at least one external electrode includes a main surface with a rectangular or substantially rectangular shape including one pair of longer sides and one pair of shorter sides, and the at least one groove is arranged so as to extend in parallel or substantially in parallel to the longer sides of the main surface of the at least one external electrode.

8. The electronic component according to claim 1, wherein the substrate body has a rectangular or substantially rectangular shape, the at least one external electrodes includes a plurality of external electrodes arranged so as to extend in parallel or substantially in parallel to at least one side of the substrate body, and the at least one groove is arranged so as to be substantially perpendicular to a direction in which the plurality of external electrodes extend.

9. The electronic component according to claim 1, wherein the at least one external electrode includes a plurality of external electrodes and the at least one groove includes a plurality of grooves, and the at least one main surface of the substrate body includes a high-density distribution area in which the external electrodes are distributed at a relatively high density and a low-density distribution area in which the external electrodes are distributed at a relatively low density, and an interval between the grooves where portions of the external electrodes in the low-density distribution area are disposed therein is shorter than an interval between the grooves where portions of the external electrodes in the high-density distribution area are disposed therein.

10. The electronic component according to claim 1, wherein the at least one groove includes a plurality of grooves, and the plurality of grooves are located in an area close to a peripheral line of the at least one main surface of the substrate body.

11. The electronic component according to claim 10, wherein a depth of the plurality of grooves relatively close to the peripheral line of the at least one main surface of the substrate body is greater than a depth of the plurality of grooves relatively far from the peripheral line of the at least one main surface of the substrate body.

12. The electronic component according to claim 1, wherein the at least one external electrode is a land grid array electrode.

13. A method of mounting the electronic component according to claim 1, wherein the at least one main surface of the substrate body where the at least one groove is formed is a mounting surface.

* * * * *